(12) United States Patent
Xu et al.

(10) Patent No.: US 11,477,921 B2
(45) Date of Patent: Oct. 18, 2022

(54) POWER CONVERSION SYSTEM AND POWER STORAGE SYSTEM

(71) Applicant: PANASONIC INTELLECTUAL PROPERTY MANAGEMENT CO., LTD., Osaka (JP)

(72) Inventors: Min Xu, Osaka (JP); Tetsuji Yamashita, Osaka (JP); Toru Matsugi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/271,105

(22) PCT Filed: Aug. 7, 2019

(86) PCT No.: PCT/JP2019/031032
§ 371 (c)(1),
(2) Date: Feb. 24, 2021

(87) PCT Pub. No.: WO2020/044990
PCT Pub. Date: Mar. 5, 2020

(65) Prior Publication Data
US 2021/0329819 A1    Oct. 21, 2021

(30) Foreign Application Priority Data
Aug. 29, 2018  (JP) .............................. JP2018-160758

(51) Int. Cl.
*H05K 7/20*  (2006.01)
*H02M 7/00*  (2006.01)
(Continued)

(52) U.S. Cl.
CPC ........ *H05K 7/20909* (2013.01); *H02M 7/003* (2013.01); *H05K 5/0213* (2013.01);
(Continued)

(58) Field of Classification Search
CPC .. H05K 7/20909; H05K 7/209; H05K 5/0213; H05K 5/0217; H05K 5/03; H02M 7/003
See application file for complete search history.

(56) References Cited

U.S. PATENT DOCUMENTS 7,813,128 B2 * 10/2010 Marchand .......... H05K 7/20909
361/695
2016/0268612 A1 * 9/2016 Ushiyama ........... H01M 8/0494
(Continued)

FOREIGN PATENT DOCUMENTS

| JP | H06-105552 A | 4/1994 |
|---|---|---|
| JP | 2004-274870 A | 9/2004 |

(Continued)

OTHER PUBLICATIONS

International Search Report and Written Opinion issued in International Patent Application No. PCT/JP2019/031032, dated Oct. 8, 2019; with partial English translation.

*Primary Examiner* — Stephen S Sul
*Assistant Examiner* — Alexander Ryan Horton
(74) *Attorney, Agent, or Firm* — McDermott Will & Emery LLP

(57) ABSTRACT

A power conversion system includes a housing (outer housing) and a power converter. The power converter is arranged in an internal space of the housing. An outer peripheral surface of the housing is provided with an air inlet and an air outlet. The air outlet communicates with the air inlet via the internal space of the housing and is located below the air inlet.

12 Claims, 10 Drawing Sheets

(51) Int. Cl.
H05K 5/02 (2006.01)
H05K 5/03 (2006.01)

(52) U.S. Cl.
CPC ............ H05K 5/0217 (2013.01); H05K 5/03 (2013.01); H05K 7/209 (2013.01)

(56) References Cited

U.S. PATENT DOCUMENTS

2018/0317348 A1    11/2018  Taga
2020/0303761 A1*    9/2020  Ballantine ........... H01M 8/2475

FOREIGN PATENT DOCUMENTS

| JP | 2016-096198 A | 5/2016 |
| JP | 2016-163392 A | 9/2016 |
| JP | 2016-171005 A | 9/2016 |
| JP | 2017-098443 A | 6/2017 |
| WO | 2017/073112 A1 | 5/2017 |

\* cited by examiner

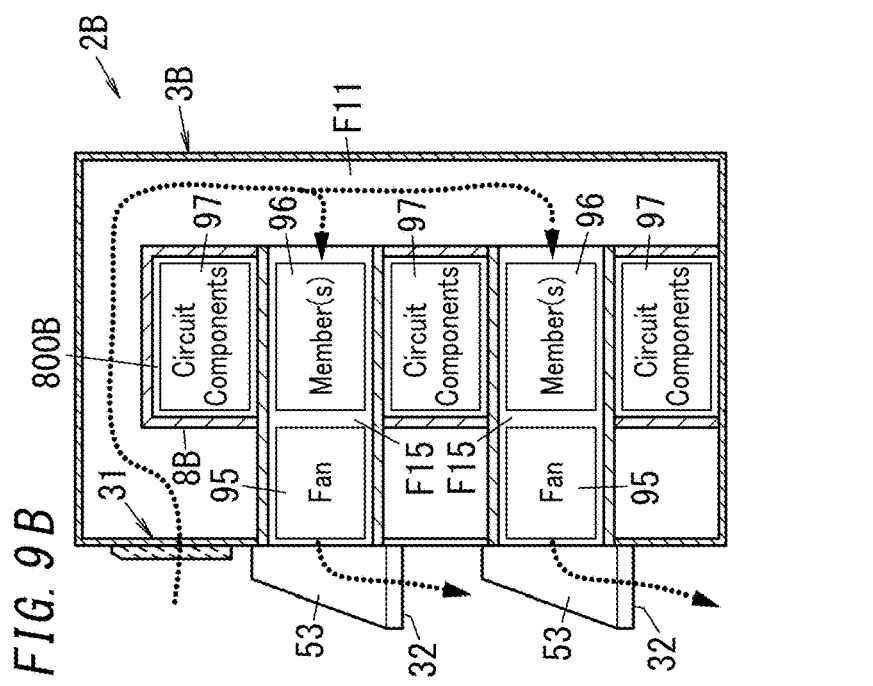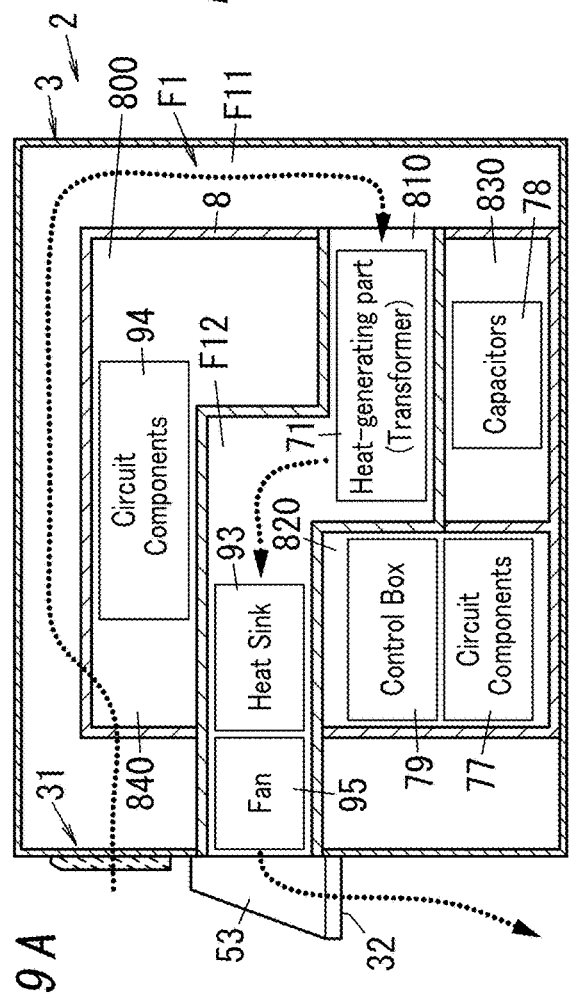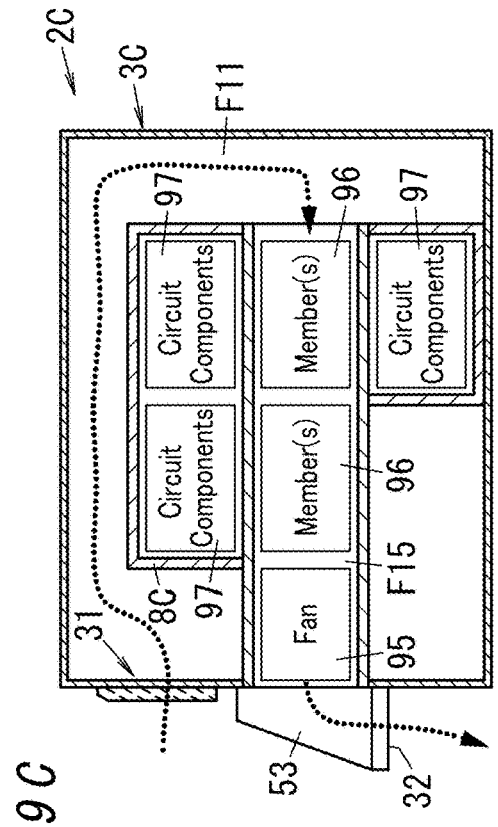

POWER CONVERSION SYSTEM AND POWER STORAGE SYSTEM

CROSS-REFERENCE OF RELATED APPLICATIONS

This application is the U.S. National Phase under 35 U.S.C. § 371 of International Patent Application No. PCT/JP2019/031032, filed on Aug. 7, 2019, which in turn claims the benefit of Japanese Application No. 2018-160758, filed on Aug. 29, 2018, the entire disclosures of which Applications are incorporated by reference herein.

TECHNICAL FIELD

The present disclosure generally relates to a power conversion system and a power storage system, and more particularly relates to a power conversion system including a housing and a power converter arranged in the internal space of the housing and a power storage system including the power conversion system.

BACKGROUND ART

A fuel cell system as disclosed in Patent Literature 1 is an exemplary known system including a housing and a power converter arranged in the internal space of the housing. In the fuel cell system, the power converter is housed in the housing. The housing has a plurality of surfaces, one of which constitutes a maintenance surface which is either is removable or openable and closable. Only the maintenance surface is provided with a gas inlet port through which an oxidant gas is introduced into the housing, a gas exhaust port through which an exhaust gas emitted from a fuel cell module is exhausted out of the housing, and a ventilation inlet (air inlet) and a ventilation outlet (air outlet) through which the internal space of the housing is ventilated with the air. The ventilation outlet is arranged above the ventilation inlet.

In the fuel cell system of Patent Literature 1, however, dust and other foreign particles could enter the internal space of the housing through the ventilation inlet and is sometimes required to reduce such chances.

CITATION LIST

Patent Literature

Patent Literature 1: JP 2016-171005 A

SUMMARY OF INVENTION

It is therefore an object of the present disclosure to provide a power conversion system and power storage system that reduces the chances of dust and other foreign particles entering the internal space of the housing through the air inlet.

A power conversion system according to an aspect of the present disclosure includes a housing and a power converter. The power converter is arranged in an internal space of the housing. An outer peripheral surface of the housing is provided with an air inlet and an air outlet. The air outlet communicates with the air inlet via the internal space of the housing and is located below the air inlet.

A power storage system according to another aspect of the present disclosure includes the power conversion system described above and a storage battery. The storage battery is to be electrically connected to the power converter.

BRIEF DESCRIPTION OF DRAWINGS

FIG. 9A is a schematic representation of the power conversion system;

FIG. 9B is a schematic representation of a power conversion system according to a first variation;

FIG. 9C is a schematic representation of a power conversion system according to a second variation.

DESCRIPTION OF EMBODIMENTS

A power conversion system and power storage system according to an exemplary embodiment will now be described with reference to the accompanying drawings. Note that the embodiment to be described below is only an exemplary one of various embodiments of the present disclosure and should not be construed as limiting. Rather, the exemplary embodiment may be readily modified in various manners depending on a design choice or any other factor without departing from the scope of the present disclosure. The drawings to be referred to in the following description of embodiments are all schematic representations. That is to say, the ratio of the dimensions (including thicknesses) of respective constituent elements illustrated on the drawings does not always reflect their actual dimensional ratio.

Figure 1:
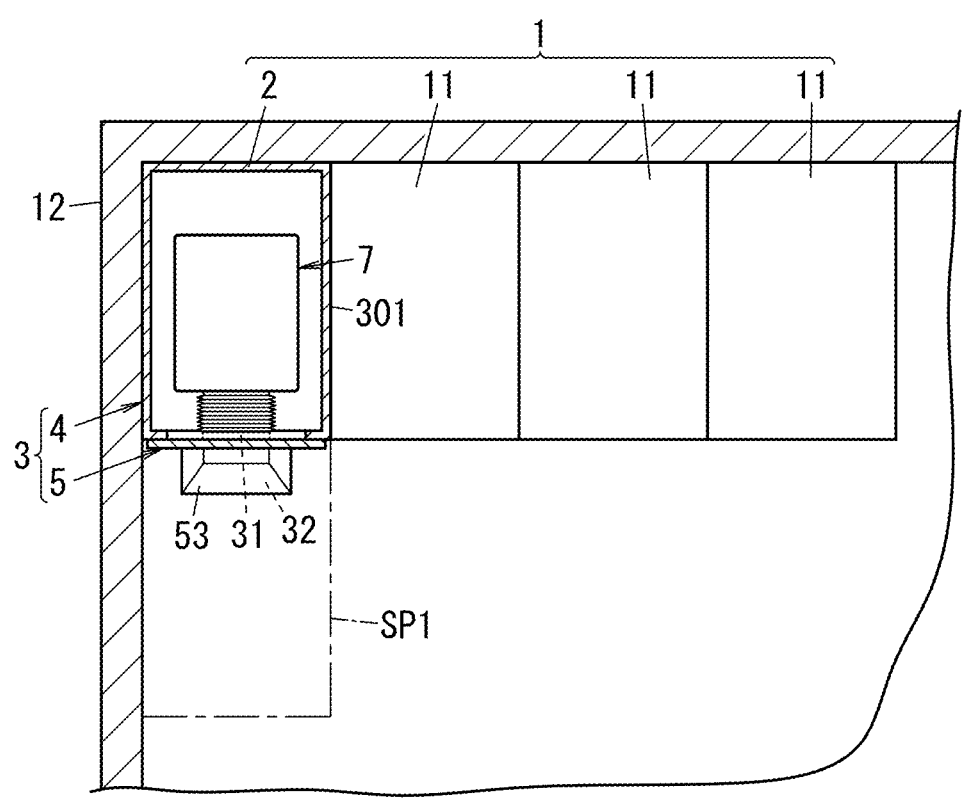
FIG. 1 is a cross-sectional view of a power storage system including a power conversion system according to an exemplary embodiment, as viewed from over the power storage system.
Figure 2:
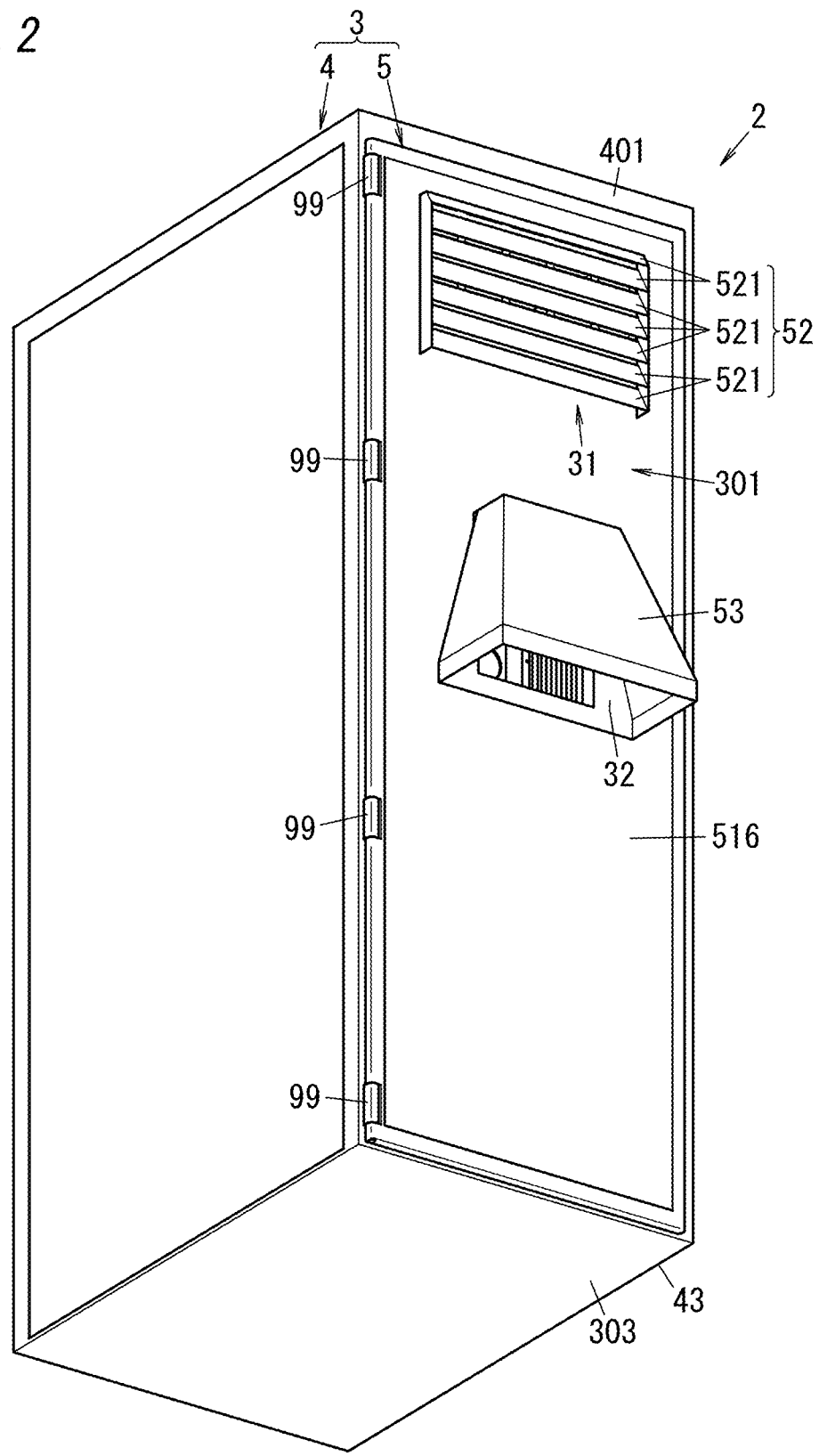
FIG. 2 is a perspective view of the power conversion system as viewed from below the power conversion system.
Figure 3:
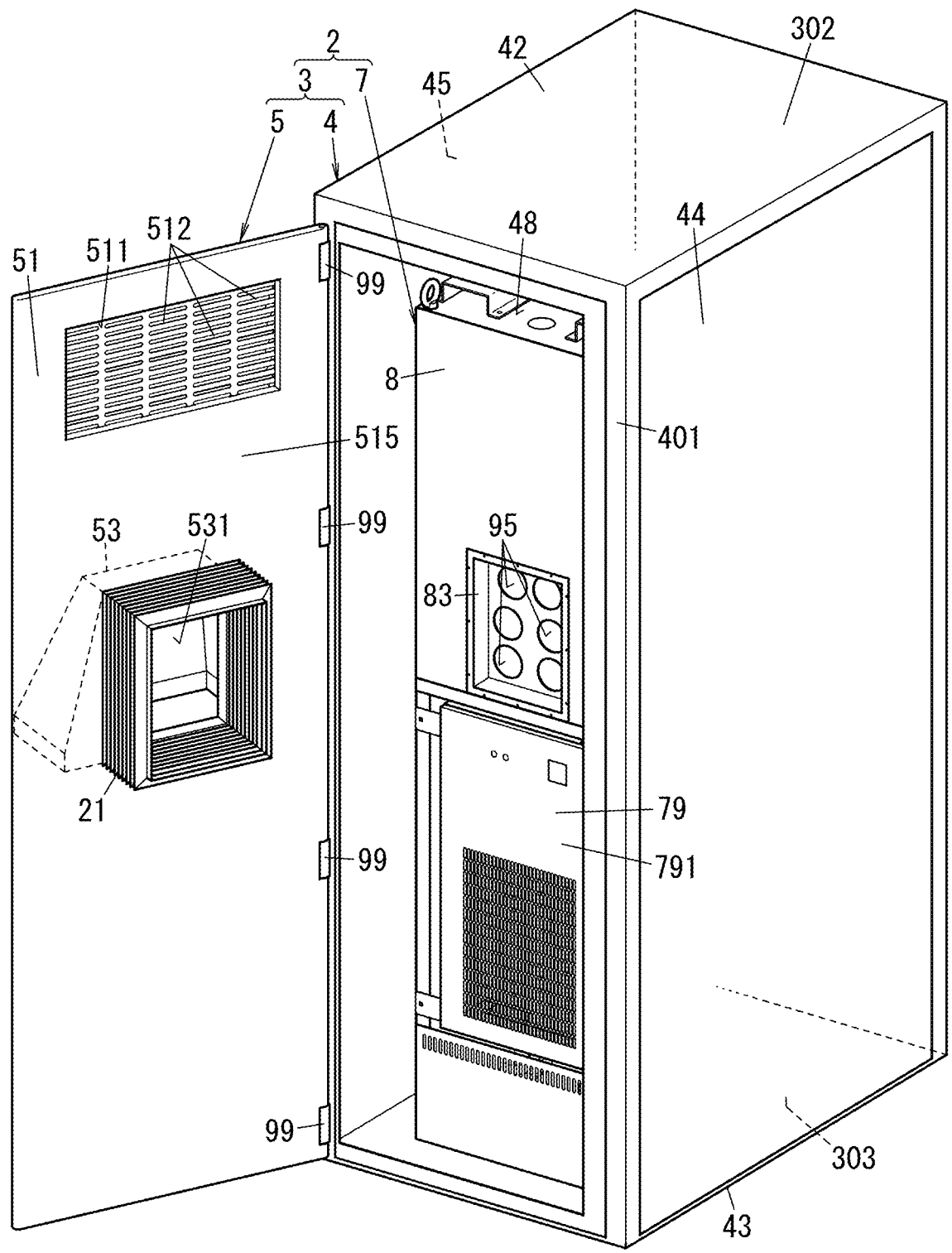
FIG. 3 is a perspective view of the power conversion system as viewed from above the power conversion system and illustrates a state where its cover is opened.

A power storage system 1 according to this embodiment includes a power conversion system 2 and a plurality of (e.g., three in the example shown in FIG. 1) storage batteries 11 as shown in FIG. 1. The power conversion system 2 includes an outer housing 3 (housing) and a power converter 7 as shown in FIGS. 2 and 3.

The power converter 7 is implemented as a power conditioner. The power converter 7 is electrically connected to the plurality of storage batteries 11. The plurality of storage batteries 7 are connected together in series, in parallel, or in a combination of both series and parallel. The power converter 7 converts DC power supplied from the plurality of storage batteries 11 into AC power and outputs the AC power to a commercial power grid or a load. In addition, the power converter 7 also converts AC power supplied from an external power supply such as the commercial power grid into DC power and outputs the DC power to the plurality of storage batteries 11. The number of the storage batteries 11 provided may be singular or plural, whichever is appropriate.

The power converter 7 does not have to be electrically connected to the single or plurality of storage batteries 11. Alternatively, the power converter 7 may also be electrically connected to a power supply such as a solar cell or a fuel cell, for example.

The outer housing 3 includes a body 4 and a cover 5. The body 4 is formed in the shape of a hollow rectangular parallelepiped. One surface 401 of the body 4 has an opening 48. The cover 5 is mounted onto the body 4. The cover 5 caps the opening 48. Also, the cover 5 may be used to cover and uncover the opening 48. Specifically, the cover 5 is mounted onto the body 4 via a plurality of (e.g., four in the example illustrated in FIG. 4) hinges 99 and turns on the plurality of hinges 99 as an axis of rotation to cover and uncover the opening 48. That is to say, the cover 5 serves as a door for the outer housing 3. The cover 5 does not have to be such a door but may also be a panel screwed onto the body 4, for example. If the cover 5 is screwed onto the body 4, the cover 5 may be removed from the body 4 by unscrewing screws.

Figure 4:
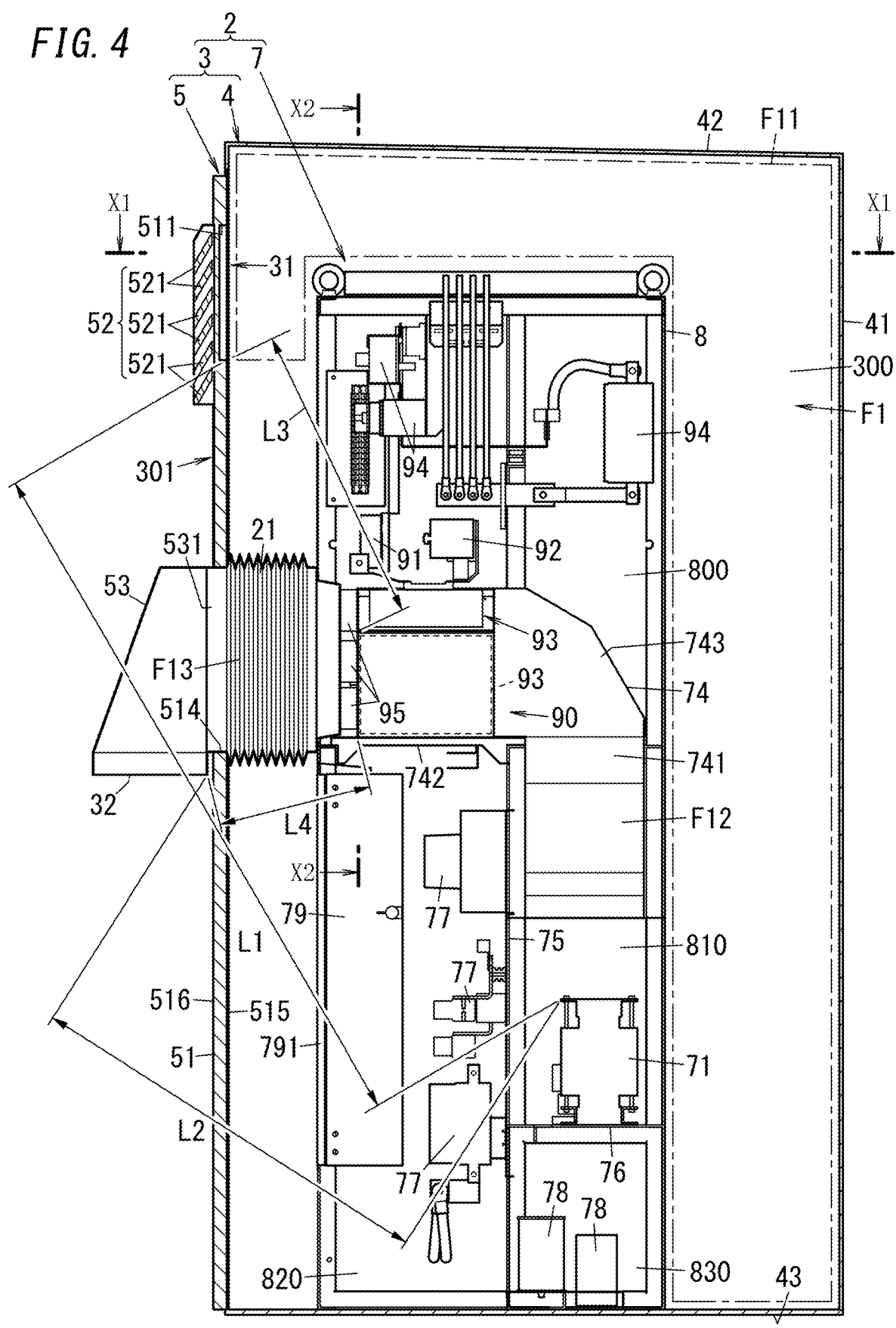
FIG. 4 is a cross-sectional view of the power conversion system as viewed from the right of the power conversion system.

The power converter 7 includes an inverter, a DC/DC converter, a plurality of switches and a plurality of interrupters, and an inner housing 8. The inverter may be implemented as, for example, a non-insulated three-phase inverter. As shown in FIG. 4, the power converter 7 is arranged in the internal space 300 of the outer housing 3. That is to say, the inner housing 8 is arranged in the internal space 300 of the outer housing 3. More specifically, the inner housing 8 is housed in the body 4 of the outer housing 3 and covered with the cover 5. The power converter 7 includes a heat-generating part that generates heat. Specifically, the power converter 7 includes a transformer 71 as the heat-generating part. The transformer 71 is one of constituent elements of the DC/DC converter of the power converter 7. The heat-generating part is arranged in the internal space 800 of the inner housing 8. The internal space 800 of the inner housing 8 forms part of the internal space 300 of the outer housing 3. Optionally, the power converter 7 may include, as a constituent element of the inverter (DC/AC converter), an AC reactor which is also a heat-generating part. The AC reactor may be arranged in, for example, a space where the transformer 71 is arranged in this embodiment (i.e., a first partitioned space 810). In the first partitioned space 810, both the transformer 71 and the AC reactor may be arranged or either the transformer 71 or the AC reactor may be arranged.

The outer housing 3 (power conversion system 2) is installed outdoors. For example, the outer housing 3 may be housed in a box called an "enclosure." In the enclosure, a plurality of storage batteries 11 (see FIG. 1) and the outer housing 3 are housed. Optionally, an air-conditioning device such as an air conditioner may also be installed in the enclosure. Also, the number of the storage batteries 11 housed in the enclosure may be singular or plural, whichever is appropriate, so is the number of the power conversion systems 2 housed in the enclosure.

The outer housing 3 may be installed in a place with a roof or in a place without a roof, whichever is appropriate. For example, the outer housing 3 may be set up on a base provided on the ground. Alternatively, the outer housing 3 may also be hung on a wall of a building, for example. Nevertheless, the power converter 7 according to this embodiment is a device for converting high-voltage power, and therefore, has a heavier weight than a device for converting low-voltage power. Thus, the outer housing 3 is suitably installed in the enclosure or set up on the base provided on the ground.

The cover 5 of the outer housing 3 includes a cover body 51, a louver 52, and an exhaust hood 53. The outer housing 3 is provided with an air inlet 31 and an air outlet 32. More specifically, in the cover 5 of the outer housing 3, the cover body 51 is provided with the air inlet 31 and the exhaust hood 53 is provided with the air outlet 32. The air outlet 32 communicates with the air inlet 31 via the internal space 300 of the outer housing 3. The air that has entered the internal space 300 of the outer housing 3 through the air inlet 31 is exhausted through the air outlet 32.

The air outlet 32 is located below the air inlet 31. That is to say, the air inlet 31 is located above the air outlet 32. This reduces the chances of sand, dirt, water drops, dust, and other foreign particles entering the internal space 300 of the outer housing 3 through the air inlet 31 compared to a situation where the vertical positional relation between the air inlet 31 and the air outlet 32 is reversed. As used herein, "up/above" and "down/below" refer to positions in a state where the outer housing 3 is set up in an installation place. The installation place may be inside the enclosure or on the base, for example. The longitudinal axis of the outer housing 3 and the longitudinal axis of the inner housing 8 are aligned with the upward/downward direction.

Also, the air around the ground may be heated by the sunshine reflected from the ground. Even in such a situation, this configuration reduces the chances of the heated air entering through the air inlet 31 because the air inlet 31 is located above the air outlet 32. This allows the power converter 7 to be cooled efficiently with the air taken in through the air inlet 31.

In addition, arranging the air inlet 31 above the air outlet 32 reduces the chances of the air inlet 31 being clogged with snow when it is snowing.

In the following description of the power conversion system 2, the cover 5 is supposed to be located "forward of" the inner housing 8 when viewed from the inner housing 8, and the inner housing 8 is supposed to be located "backward of" the cover 5 when viewed from the cover 5. Also, the rightward/leftward direction is herein defined with respect to the power conversion system 2 when the power conversion system 2 is viewed from in front of the power conversion system 2.

The body 4 may be formed out of an iron plate, for example. As shown in FIGS. 3 and 4, the body 4 has a rear wall 41, an upper wall 42, a lower wall 43, a right wall 44, and a left wall 45. From the peripheral edges of the rear wall 41 with a rectangular shape, the upper wall 42, the lower wall 43, the right wall 44, and the left wall 45, each also having a rectangular shape, all protrude forward.

The cover body 51 may be formed out of an iron plate, for example. The cover body 51 has a rectangular plate shape. The cover body 51 is mounted onto the front end of the left wall 45 via the plurality of hinges 99. The cover body 51 has a recess 511. The recess 511 of the cover body 51 is depressed from an inner surface 515 of the cover body 51 toward an outer surface 516 thereof. The recess 511 is provided around an upper end of the cover body 51. The bottom surface of the recess 511 has the shape of a grid with a plurality of elongate holes 512. The longitudinal axis of the plurality of elongate holes 512 is aligned with the rightward/leftward direction.

The louver 52 of the cover 5 is attached onto the outer surface 516 of the cover body 51. The louver 52 overlaps with the recess 511 in the forward/backward direction. The louver 52 includes a plurality of blades 521. Each of the plurality of blades 521 extends obliquely downward from around an associated one of the plurality of elongate holes 512 toward the outside of the outer housing 3. The plurality of blades 521 are arranged one on top of another in the upward/downward direction. The plurality of blades 521 are arranged parallel to each other with a space left between each pair of the blades 521. The environment outside of the outer housing 3 communicates with the internal space 300 of the outer housing 3 via the spaces between the plurality of blades 521 and the plurality of elongate holes 512 provided through the cover body 51.

The plurality of elongate holes 512 provided through the cover body 51 together form the air inlet 31. That is to say, the air enters the internal space 300 of the outer housing 3 from outside of the outer housing 3 through the spaces between the plurality of blades 521 and the plurality of elongate holes 512.

As used herein, the air inlet 31 may be defined as including the spaces between the plurality of blades 521 and the plurality of elongate holes 512 provided through the cover body 51. In that case, the air inlet 31 is provided over the outer surface of the louver 52, which forms part of the outer peripheral surface 301 of the outer housing 3, and over a region, facing the louver 52 in the forward/backward direction, of the outer surface 516 of the cover body 51. Also, in that case, if the air inlet 31 is located above the air outlet 32, then it means that both the spaces between the plurality of blades 521 and the plurality of elongate holes 512 are located above the air outlet 32.

Optionally, a dustproof filter may be attached to the air inlet 31. The dustproof filter may be attached, for example, to the recess 511 provided through the cover body 51.

The exhaust hood 53 of the cover 5 has the shape of a hollow truncated pyramid. A window 531 is provided at the rear end of the exhaust hood 53. The exhaust hood 53 is attached to the cover body 51 so as to protrude forward from the cover body 51. More specifically, a window 514 is provided through the cover body 51 and a peripheral edge portion, surrounding the window 531, of the exhaust hood 53 is fitted into the window 514 provided through the cover body 51. The height, as measured with respect to the cover body 51, of the exhaust hood 53 that protrudes forward increases as the distance to the bottom of the exhaust hood 53 decreases.

The exhaust hood 53 is provided with not only the window 531 but also the air outlet 32 as well. The window 531 and the air outlet 32 communicate with each other via the internal space of the exhaust hood 53. The air outlet 32 is provided through the lower surface of the exhaust hood 53. The air outlet 32 downwardly regulates the flow of the air blowing from the internal space 300 of the outer housing 3 toward the outside of the outer housing 3. This reduces the permeation of rainwater through the air outlet 32.

The air outlet 32 is located below the air inlet 31. Thus, making the air outlet 32 downwardly regulate the flow of the air blowing from the internal space 300 of the outer housing 3 toward the outside of the outer housing 3 as is done in this embodiment causes the air exhausted from the air outlet 32 to blow away from (i.e., in the opposite direction from) the air inlet 31 (i.e., not upward but downward). This reduces the chances of the air exhausted from the air outlet 32 being sucked in through the air inlet 31.

The outer surface 516 of the cover body 51, the outer surface of the louver 52, the outer surface of the exhaust hood 53, the outer surface of the right wall 44 of the body 4, the outer surface of the left wall 45 thereof, and the outer surface of the rear wall 41 thereof together form the outer peripheral surface 301 of the outer housing 3. That is to say, the "outer peripheral surface 301 of the outer housing 3" means all the outer surfaces of the outer housing 3 but the upper surface 302 and lower surface 303 of the outer housing 3. The air inlet 31 is provided through a region, facing the louver 52, of the outer surface 516 of cover body 51. The air outlet 32 is provided through the outer surface of the exhaust hood 53 which forms part of the outer peripheral surface 301.

The air inlet 31 and the air outlet 32 are provided through a region, located on one end in one direction, of the outer peripheral surface 301 of the outer housing 3. Furthermore, the air inlet 31 and the window 514 coupled to the air outlet 32 are provided through the same surface out of the outer peripheral surface 301 of the outer housing 3. Specifically, the air inlet 31 and the air outlet 32 are both provided through the cover 5. In this case, the "one direction" is the forward/backward direction and the "one end in the one direction" is the front end. The cover 5 of the outer housing 3 is a constituent member, located at the front end, of the outer housing 3 and caps the internal space 300 of the outer housing 3 from the front.

The air inlet 31 and the air outlet 32 are provided through a front region of the outer peripheral surface 301 of the outer housing 3. Thus, around the outer housing 3, a space SP1 needs to be left only in front of the outer housing 3 (i.e., in a lower part of the paper on which FIG. 1 is drawn) without leaving any space on the right, left, or behind the outer housing 3 as shown in FIG. 1. That is to say, even if any equipment such as the storage batteries 11 or the wall 12 (such as a structural portion of the enclosure) is arranged on the right, left, or behind the outer housing 3, the air may still be sucked in through the air inlet 31 and exhausted through the air outlet 32. This makes it possible to cut down the spaces to be left around the outer housing 3 compared to a situation where the air inlet 31 is provided through a front region of the outer peripheral surface 301 of the outer housing 3 and air outlet 32 is provided through a right, left, or rear region of the outer peripheral surface 301.

Also, when operating, or do maintenance of, the power conversion system 2, the operator opens and closes the cover 5. In that case, the cover 5 opened is located in the space SP1 in front of the outer housing 3. This allows the operator to enter the space SP1 and access the power converter 7. Thus, there is no need to leave any space on the right or left of, or behind, the outer housing 3.

In addition, to form the air inlet 31 and the air outlet 32, only the cover 5 needs to be subjected to machining. This may reduce the machining cost of the outer housing 3 compared to a situation where one of the air inlet 31 or the air outlet 32 is provided through the cover 5 and the other is provided through the body 4.

As shown in FIGS. 3 and 4, the power conversion system 2 further includes a deformable portion 21 which is stretchable and shrinkable. The deformable portion 21 is a bellows with a square tubular shape. The deformable portion 21 is stretchable and shrinkable in an axial direction. The deformable portion 21 may be made of a combination of materials such as rubber and a metal or a resin and a metal. A first end of the deformable portion 21 is attached to peripheral edges of the window 514 provided through the cover body 51. As shown in FIG. 3, when the opening 48 provided through the body 4 is uncovered by the cover 5, a second end of the deformable portion 21 is out of contact with any member and the deformable portion 21 is not compressed. The deformable portion 21 does not have to have the square tubular shape but may also have a cylindrical shape, for example.

Figure 5:
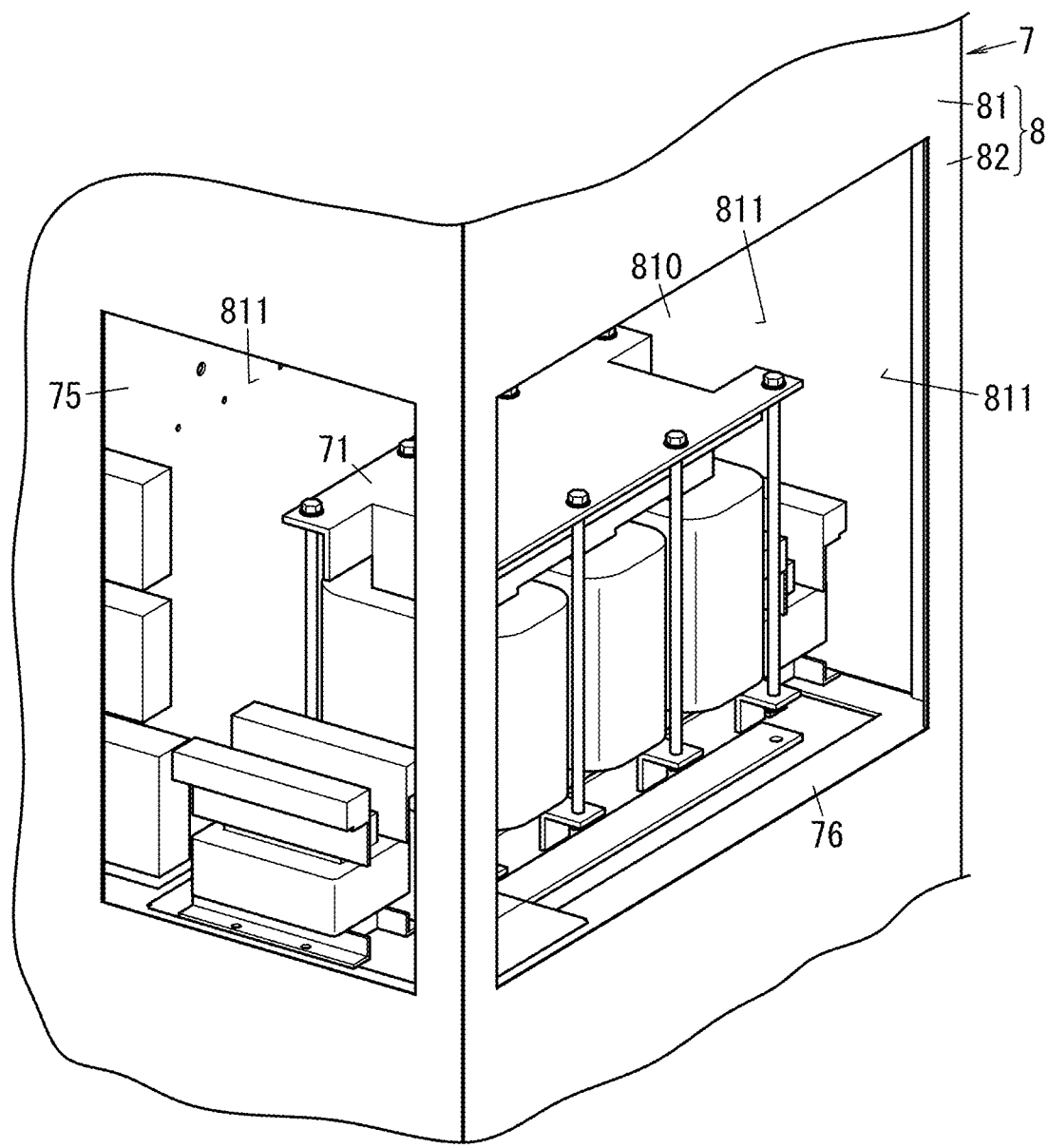
FIG. 5 is a perspective view illustrating a principal part of an inner housing of the power conversion system.

As shown in FIG. 5, the inner housing 8 includes outer walls 81 and a framework 82 that supports the outer walls 81. The outer walls 81 may be formed out of an iron plate, for example. A window 83 (see FIG. 3) is provided through one of the outer walls 81 of the inner housing 8. As shown in FIG. 4, when the opening 48 provided through the body 4 is capped with the cover 5, the second end of the deformable portion 21 is in contact with the peripheral edges of the window 83 of the outer wall 81. In that case, the deformable portion 21 is sandwiched between the cover body 51 and the inner housing 8 to be compressed and deformed. This brings the second end of the deformable portion 21 into close contact with the inner housing 8.

Figure 6:
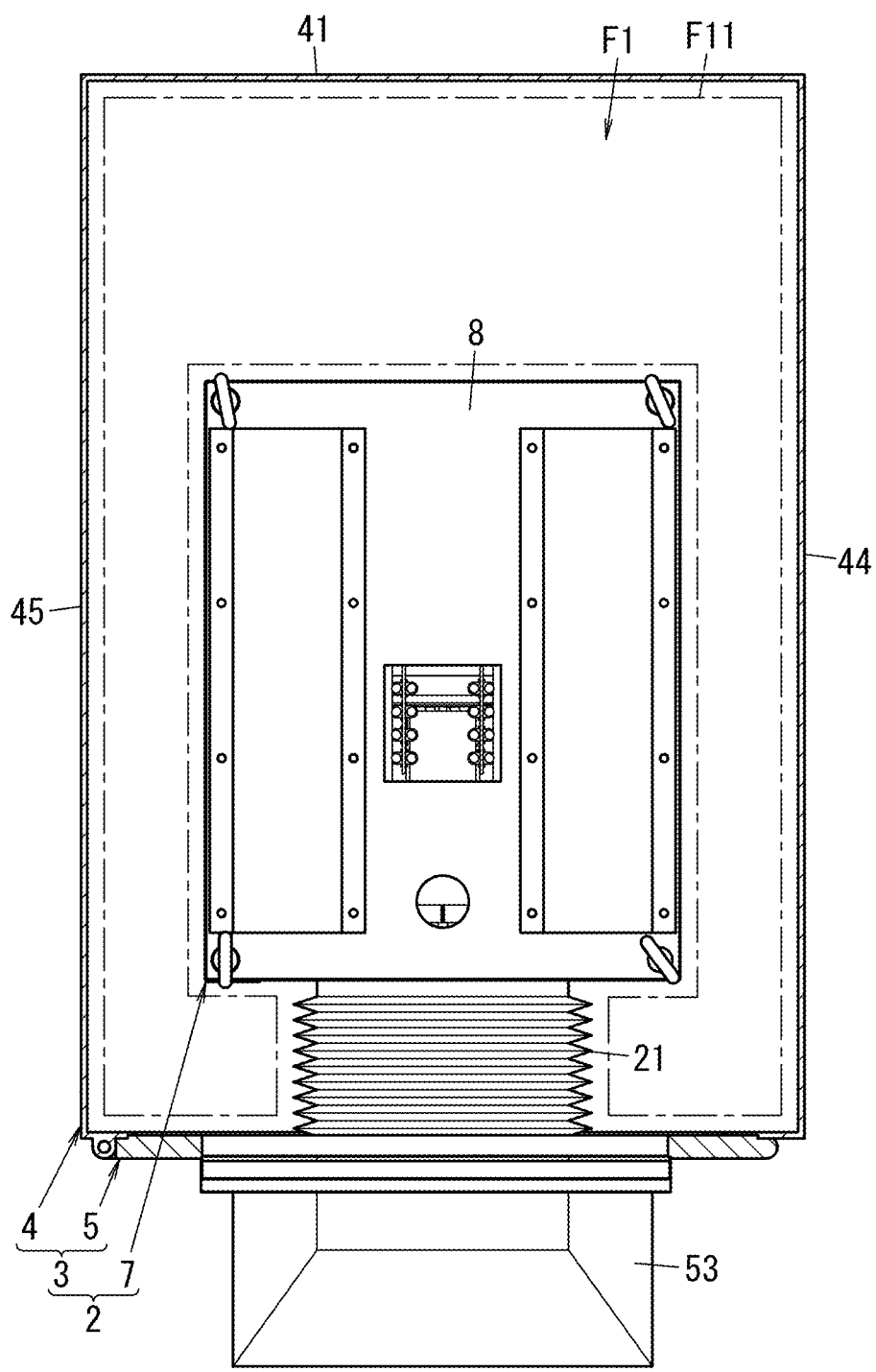
FIG. 6 is a cross-sectional view thereof taken along the plane X1-X1 shown in FIG. 4.

As shown in FIGS. 4 and 6, an air flow channel F1 between the air inlet 31 and the air outlet 32 is formed in the internal space 300 of the outer housing 3 The space (flow channel F11) between the inner housing 8 and the outer housing 3 forms part of the flow channel F1. That is to say, there is a gap between every surface (but the lower surface) of the inner housing 8 and the outer housing 3 and the gap constitutes the flow channel F11. The flow channel F11 is formed at least over, behind, and on the right and left of, the inner housing 8. The flow channel F1 is a first region through which the air sucked in through the air inlet 31 flows.

The presence of the air in the flow channel F11 decreases the transfer of heat from outside of the outer housing 3 into the inner housing 8 of the power converter 7. This reduces, when the outer housing 3 is heated by the sunshine, for example, an increase in the temperature of the power converter 7.

The air inlet 31 is located at least partially above the inner housing 8. More specifically, the upper end of the air inlet 31 is located above the inner housing 8. This allows the air that has entered the internal space 300 of the outer housing 3 through the air inlet 31 to pass through the space over the inner housing 8 more easily. Consequently, the air may flow more smoothly through the internal space 300.

The internal space (flow channel F13) of the deformable portion 21 forms part of the flow channel F1 and communicates with the air outlet 32. The flow of the air from the space between the front surface of the inner housing 8 and the front inner surface of the outer housing 3 toward the air outlet 32 is obstructed by the peripheral surface of the deformable portion 21. Thus, the air that has entered the internal space 300 of the outer housing 3 through the air inlet 31 flows toward the air outlet 32 via the internal space 800 of the inner housing 8 as will be described later. That is to say, the deformable portion 21 regulates the flow channel of the air.

As shown in FIGS. 4 and 5, the power converter 7 further includes a duct 74, a first partition plate 75, and a second partition plate 76. The duct 74, the first partition plate 75, and the second partition plate 76 are arranged in the internal space 800 of the inner housing 8.

The internal space 800 of the inner housing 8 includes a first partitioned space 810 (first region), a second partitioned space 820 (second region), and a third partitioned space 830 (second region). The first partitioned space 810 forms part of the flow channel F1. The air sucked in through the air inlet 31 passes through the first partitioned space 810. The first partitioned space 810 is provided at a rear end of a lower part of the inner housing 8. A transformer 71, which is a heat-generating part, is arranged in the first partitioned space 810. In this embodiment, the transformer 71 is a three-wire transformer for alternating current. The transformer 71 is secured with screws onto the second partition plate 76. The second partitioned space 820 is provided in front of the first partitioned space 810. The first partitioned space 810 and the second partitioned space 820 are separated from each other by the first partition plate 75. The power converter 7 includes a plurality of circuit components 77 arranged in the second partitioned space 820. The first partition plate 75 is a printed wiring board on which the plurality of circuit components 77 are assembled together. The plurality of circuit components 77 may include, for example, switches and interrupters, which are constituent elements of the power converter 7. These switches and interrupters are connected to a cable for outputting AC power to a commercial power grid or a load. The third partitioned space 830 is provided under the first partitioned space 810. The first partitioned space 810 and the third partitioned space 830 are separated from each other by the second partition plate 76. The power converter 7 includes a plurality of circuit components 78 arranged in the third partitioned space 830. Each of the plurality of circuit components 78 may be a capacitor, for example. The second partitioned space 820 and the third partitioned space 830 communicate with each other.

As used herein, to "partition" means providing a wall or any other partitioning member for a space to partition the space into a plurality of spaces that are separated from each other by the wall or any other partitioning member. The plurality of spaces may be separated from each other by the wall or any other partitioning member with no gap left between them to prevent the air from flowing back and forth between them. Alternatively, the air may flow back and forth between the plurality of spaces.

The power converter 7 further includes a control box 79. The control box 79 is used to selectively electrically connect or disconnect the power converter 7 to/from the plurality of storage batteries 11 (see FIG. 1), a commercial power grid, and a load. The control box 79 covers the second partitioned space 820 from the front. The control box 79 has a door 791. The door 791 forms part of the front surface of the inner housing 8. The door 791 faces the cover 5.

The first partitioned space 810 is separated from the second and third partitioned spaces 820, 830 by the first partition plate 75, the second partition plate 76, and the outer walls 81 of the inner housing 8. Optionally, the first partitioned space 810 may communicate with the second and third partitioned spaces 820, 830 via a hole through which a cable connected to the circuit component 77 or 78 passes. The gap between the inner edge of the hole and the cable is suitably closed with a seal member made of silicone rubber as a material.

As shown in FIG. 5, the outer walls 81 of the inner housing 8 have a plurality of (e.g., three in the example shown in FIG. 5) through holes 811. The plurality of through holes 811 exposes the first partitioned space 810, which forms part of the internal space 800 of the inner housing 8, to the space (flow channel F11) between the inner housing 8 and the outer housing 3. The plurality of through holes 811 are provided through the rear, right, and left surfaces of the inner housing 8. The direction leading from the space (flow channel F11) between the inner housing 8 and the outer housing 3 toward the internal space 800 (first partitioned space 810) of the inner housing 8 via any of the three through holes 811 is different from one of the three through holes 811 to another. Specifically, the direction leading from the flow channel F11 toward the first partitioned space 810 is the forward direction when passing through the through hole 811 provided through the rear surface of the inner housing 8, the leftward direction when passing through the through hole 811 provided through the right surface of the inner housing 8, and the rightward direction when passing through the through hole 811 provided through the left surface of the inner housing 8. That is to say, the air in the flow channel F11 flows in three different directions through the three through holes 811 before entering the first partitioned space 810. The plurality of through holes 811 are separated from each other by the framework 82. Alternatively, the plurality of through holes 811 may communicate with each other.

In FIG. 4, the internal space (flow channel F12) of the duct 74 forms part of the flow channel F1 between the air inlet 31 and the air outlet 32. The duct 74 includes a first cylindrical portion 741 with the shape of a cylinder extending in the upward/downward direction, a second cylindrical portion 742 with the shape of a cylinder extending in the forward/backward direction, and a coupling portion 743 that couples together an upper end of the first cylindrical portion 741 and a rear end of the second cylindrical portion 742. In the first and second cylindrical portions 741, 742, the duct 74 has a rectangular cross-sectional shape. As used herein, the "cross-sectional shape of the duct 74" refers to the cross-sectional shape of a plane taken perpendicularly to a flow channel axis of the duct 74. The flow channel F12 inside the duct 74 communicates with the first partitioned space 810 at the lower end of the first cylindrical portion 741. The flow channel F12 also communicates with the flow channel F13 inside the deformable portion 21 at a front end of the second cylindrical portion 742 of the duct 74. The flow channel F12 inside the duct 74 communicates with the air outlet 32 via the flow channel F13 inside the deformable portion 21.

Figure 7A:
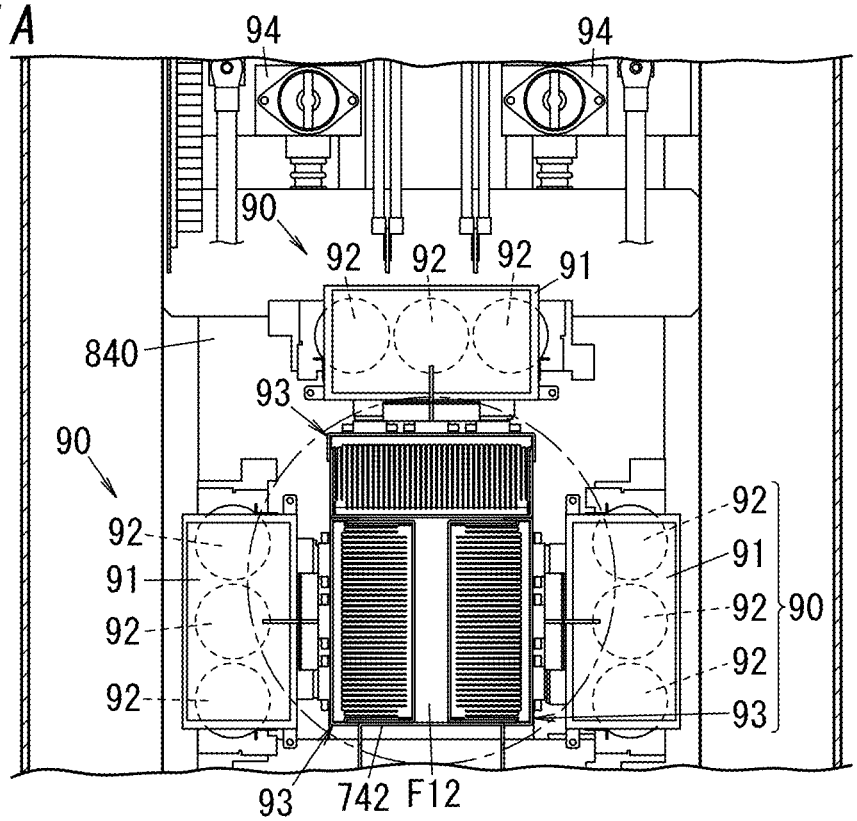
FIG. 7A is a cross-sectional view thereof taken along the plane X2-X2 shown in FIG. 4.
Figure 7B:
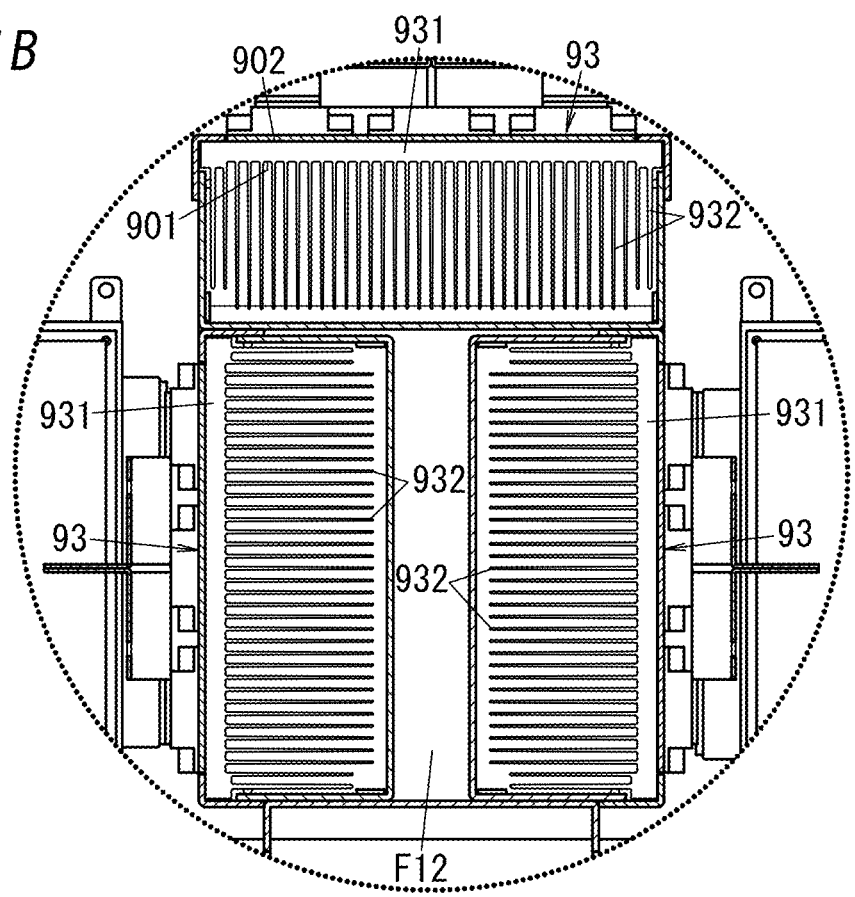
FIG. 7B is an enlarged view of a part indicated by the one-dot-chain circle in FIG. 7A.

As shown in FIGS. 7A and 7B, the power conversion system 2 includes a plurality of (e.g., three in the example illustrated in FIG. 7A) stack members 90. Each of the plurality of stack members 90 includes a power device 91 and a plurality of condensers 92, which are heat-generating parts that generate heat, and a heat sink 93 serving as a heat-dissipating member. That is to say, the power conversion system 2 includes a plurality of (e.g., three in the example illustrated in FIG. 7A) heat sinks 93. Each of the plurality of heat sinks 93 includes a supporting member 931 and a plurality of fins 932. The supporting member 931 has a plate shape. The supporting member 931 has a first surface 901 and a second surface 902, which are both surfaces thereof in the thickness direction. The plurality of fins 932 protrudes from the first surface 901 of the supporting member 931.

In each of the plurality of heat sinks 93, the supporting member 931 forms part of the second cylindrical portion 742 of the duct 74. More specifically, one of the plurality of (three) heat sinks 93 includes a part of the upper surface of the second cylindrical portion 742, another heat sink 93 includes a part of the left surface of the second cylindrical portion 742, and the other heat sink 93 includes a part of the right surface of the second cylindrical portion 742. In each heat sink 93, the plurality of fins 932 protrudes from the supporting member 931 toward the inside of the duct 74. The plurality of fins 932 is arranged inside the second cylindrical portion 742 in the flow channel F12 inside the duct 74. Alternatively, the plurality of fins 932 may protrude from the inner peripheral surface of the second cylindrical portion 742.

In the region where the plurality of fins 932 is arranged, the direction in which the flow channel F12 runs inside the duct 74 is the forward/backward direction. The thickness of the plurality of fins 932 intersects with the direction in which the flow channel F12 runs inside the duct 74. In one heat sink 93, including a part of the upper surface of the second cylindrical portion 742, out of the plurality of (e.g., three) heat sinks 93, the thickness of the plurality of fins 932 is the rightward/leftward direction. In the other two heat sinks 93 out of the plurality of heat sinks 93, the thickness of the plurality of fins 932 is the upward/downward direction. Also, the direction in which the plurality of fins 932 protrudes from the supporting member 931 intersects with the direction in which the flow channel F12 runs inside the duct 74. Arranging the plurality of fins 932 in a wall shape allows a plurality of grooves to be formed. That is to say, a plurality of grooves, of which the bottom is defined by the supporting member 931 and the side surfaces are defined by the plurality of fins 932, are formed. The direction in which the plurality of grooves extends (i.e., the direction in which the viewer looks straight at the paper on which FIG. 7B is drawn) is the direction aligned with the flow channel F12. Along the flow channel F12, the air passes through the gaps between the plurality of fins 932.

In each of the plurality of stack members 90, the power device 91 and the plurality of condensers 92 are mounted on the second surface 902 of the supporting member 931 of the heat sink 93. The power device 91 may be, for example, an insulated gate bipolar transistor (IGBT) or a metal-oxide semiconductor field-effect transistor (MOSFET). The plurality of power devices 91 and the plurality of condensers 92 of the plurality of stack members 90 together form an inverter of the power converter 7. The second surface 902 is an opposite surface with respect to the flow channel F12 inside the duct 74. That is to say, the plurality of heat sinks 93 is arranged along the flow channel F12 (first region), while the power device 91 and the plurality of condensers 92 are arranged in the space 840 (second region) around and over the flow channel F12. The duct 74 separates the flow channel F12 from the space 840.

Over the power device 91 and the plurality of condensers 92, arranged is the plurality of circuit components 94. The plurality of circuit components 94 may include, for example, switches and interrupters, which are constituent elements of the power converter 7. These switches and interrupters are connected to a cable, to which DC power is supplied from the plurality of storage batteries 11 (see FIG. 1).

Figure 8:
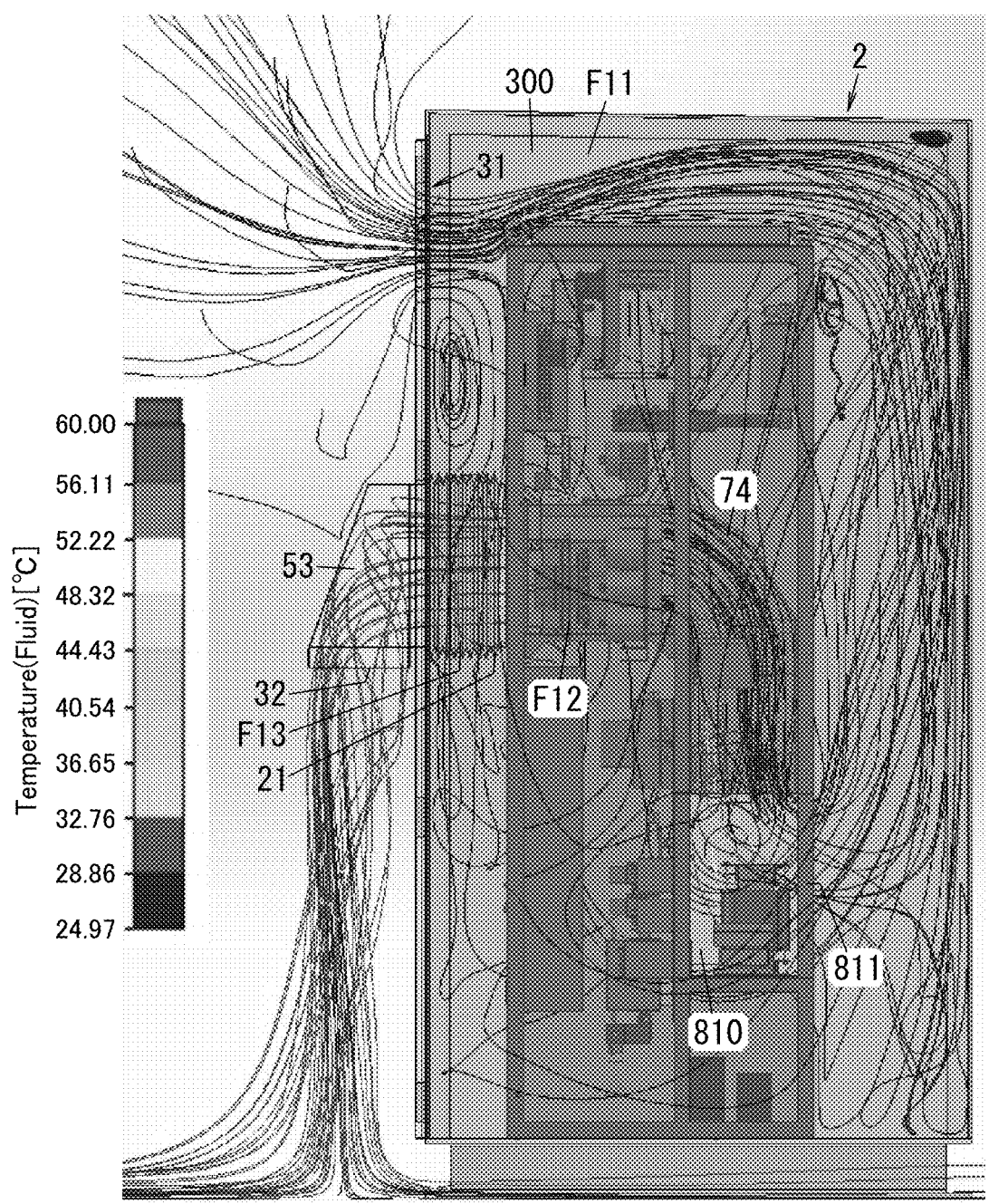
FIG. 8 shows results of analysis of air flows and an air temperature distribution in a power conversion system according to an exemplary embodiment.

FIG. 8 shows results of analysis of air flows and an air temperature distribution in the power conversion system 2. The air that has entered the internal space 300 of the outer housing 3 through the air inlet 31 passes through the flow channel F11 between the inner housing 8 and the outer housing 3 and flows into the first partitioned space 810 through the plurality of through holes 811. The air that has entered the first partitioned space 810 passes through the flow channel F12 inside the duct 74, the flow channel F13 inside the deformable portion 21, and the internal space of the exhaust hood 53 and then is exhausted through the air outlet 32. According to the results of analysis, the air in the flow channel F12 inside the duct 74 has a higher temperature than the air around the air inlet 31 and in the flow channel F11. In addition, the air at the air outlet 32 has a higher temperature than the air behind the plurality of heat sinks 93 (see FIG. 4) in the flow channel F12.

The air temperature distribution shown in FIG. 8 will be described in further detail. Outside of the outer housing 3, the temperature of the air going to be sucked in through the air inlet 31 falls within a first temperature range from 24.97° C. to 28.86° C. The temperature of the air in the flow channel F11 falls within the first temperature range. The temperature of the air in the flow channel F12 inside the duct 74 falls within a combined range of the first temperature range, a second temperature range from 28.86° C. to 32.76° C., and a third temperature range from 32.76° C. to 36.65° C. The temperature of the air in the internal space of the exhaust hood 53 falls within a combined range of the second temperature range, the third temperature range, and a fourth temperature range from 36.65° C. to 40.54° C. The temperature of the air exhausted from the air outlet 32 falls within a combined range of the first, second, and third temperature ranges. The first partitioned space 810 has the air, of which the temperature is even higher than the fourth temperature range.

As shown in FIGS. 3 and 4, the power conversion system 2 further includes a plurality of (e.g., six in the example illustrated in FIG. 3) fans 95. The plurality of fans 95 is arranged in the internal space 300 of the outer housing 3. The plurality of fans 95 produces an airflow blowing from the air inlet 31 toward the air outlet 32 via the internal space 300 of the outer housing 3. In the internal space 300, the plurality of fans 95 is arranged to face the cover 5. More specifically, the plurality of fans 95 is arranged at the front end of the second cylindrical portion 742 of the duct 74. As shown in FIG. 3, when the cover 5 uncovers the opening 48 provided through the body 4, the plurality of fans 95 is exposed out of the inner housing 8. As shown in FIG. 4, when the cover 5 caps the opening 48 of the body 4, the plurality of fans 95 is arranged between the air outlet 32 and the plurality of heat sinks 93. More specifically, when the cover 5 caps the opening 48 of the body 4, the plurality of fans 95 is arranged between the deformable portion 21 and the plurality of heat sinks 93. The plurality of fans 95 blows the air in the internal space of the duct 74 toward the air outlet 32.

FIG. 9A schematically illustrates an arrangement of respective constituent elements in the power conversion system 2. FIG. 9A is a right side view of the power conversion system 2. The flow channel F11 between the inner housing 8 and the outer housing 3 communicates with the first partitioned space 810 that forms part of the internal space 800 of the inner housing 8. The first partitioned space 810 communicates with the flow channel F12 inside the duct 74 (see FIG. 4). In the first partitioned space 810, arranged is the transformer 71 serving as a heat-generating part. In the flow channel F12, arranged are the heat sinks 93 which form part of the plurality of stack members 90 (see FIG. 7A). The flow channel F12 communicates with the air outlet 32. Between the flow channel F12 and the air outlet 32, arranged is a plurality of fans 95 (see FIG. 3). Also, in the space 840 around and over the flow channel F12 in the internal space 800 of the inner housing 8, arranged is a plurality of circuit components 94 including switches and interrupters. In the second partitioned space 820 under the flow channel F12, arranged are the control box 79 and the plurality of circuit components 77. In the third partitioned space 830 under the first partitioned space 810, arranged are the circuit components 78 (capacitors). A partition is provided between the flow channel F1 and each of the space 840, the second partitioned space 820, and the third partitioned space 830.

As shown in FIG. 4, the airline distance L1 between the transformer 71 as a heat-generating part and the air inlet 31 is longer than the airline distance L2 between the transformer 71 and the air outlet 32. Thus, this allows, compared to a situation where the relation in length between the airline distances L1, L2 is reversed (i.e., the airline distance L1 is shorter than the airline distance L2), the air that has absorbed the heat generated by the transformer 71 to reach the air outlet 32 by going over a shorter distance. This increases the efficiency of dissipating heat from the transformer 71 to the outside of the outer housing 3. In this case, the airline distance L1 may be defined, for example, as an airline distance from a point, closest to the air inlet 31, on the transformer 71 to a point, closest to the transformer 71, on the air inlet 31. The airline distance L2 may be defined, for example, as an airline distance from a point, closest to the air outlet 32, on the transformer 71 to a point, closest to the transformer 71, on the air outlet 32.

Also, a course (which is either a curve or a combination of a line and a curve) that connects the transformer 71 to the air inlet 31 along the flow channel F1 (see FIG. 9A) is longer than a course that connects the transformer 71 to the air outlet 32 along the flow channel F1.

Furthermore, each of the plurality of stack members 90 includes the power device 91 and the plurality of condensers 92, which are heat-generating parts, and the heat sink 93 serving as a heat-dissipating member. The airline distance between each of the plurality of stack members 90 and the air inlet 31 is longer than the airline distance between the stack member 90 and the air outlet 32. In FIG. 4, an airline distance L3 between one stack member 90 and the air inlet 31 and an airline distance L4 between the stack member 90 and the air outlet 32 are also illustrated. Furthermore, a course (which is either a curve or a combination of a line and a curve) that connects each of the plurality of stack members 90 to the air inlet 31 along the flow channel F1 is longer than a course that connects the stack member 90 to the air outlet 32 along the flow channel F1.

In the internal space 800 of the inner housing 8, the second region (including the second partitioned space 820, the third partitioned space 830, and the space 840) is separated from the first region (flow channel F1) through which the air sucked in through the air inlet 31 passes. Thus, the chances of the circuit components 77, 78, 94 and other constituent elements arranged in the second region collecting sand, dirt, water droplets, dust, and other foreign particles are slimmer than when arranged in the first region. On the other hand, since the air sucked in through the air inlet 31 passes through the first region, the transformer 71 and the plurality of heat sinks 93 arranged in the first region may be cooled more smoothly than when arranged in the second region.

Variations of Exemplary Embodiment

Next, variations of the exemplary embodiment will be described. Optionally, the variations to be described below may be adopted in combination as appropriate. In the following description of the variations, any constituent element, having the same function as a counterpart of the power conversion system 2 according to the exemplary embodiment described above, will not be described all over again.

FIG. 9B illustrates a power conversion system 2B according to a first variation. As shown in FIG. 9B, the outer housing 3B may have a plurality of (e.g., two in the example illustrated in FIG. 9B) air outlets 32. In addition, in the internal space 800B of the inner housing 8B, a plurality of (e.g., two in the example illustrated in FIG. 9B) flow channels F15 corresponding one to one to the plurality of air outlets 32 may be provided. The first end of each of the plurality of flow channels F15 communicates with the flow channel F11 between the inner housing 8B and the outer housing 3B and the second end thereof communicates with its associated air outlet 32. In each of the plurality of flow channels F15, at least part of a single or a plurality of members 96 (e.g., a transformer serving as a heat-generating part and a heat sink serving as a heat-dissipating member) and a single or a plurality of fans 95 are arranged. In addition, between and around the plurality of flow channels F15, arranged is the plurality of circuit components 97. The plurality of circuit components 97 corresponds to the circuit components 77, 78, and 94 according to the exemplary embodiment described above.

FIG. 9C illustrates a power conversion system 2C according to a second variation. As shown in FIGS. 9B and 9C, the flow channel F15 connecting the flow channel F11 between the inner housing 8C and the outer housing 3C to the internal space of the exhaust hood 53 may be a linear one. In addition, as shown in FIG. 9C, the plurality of members 96 may be arranged side by side in the direction in which the flow channel F15 runs.

Figure 10:
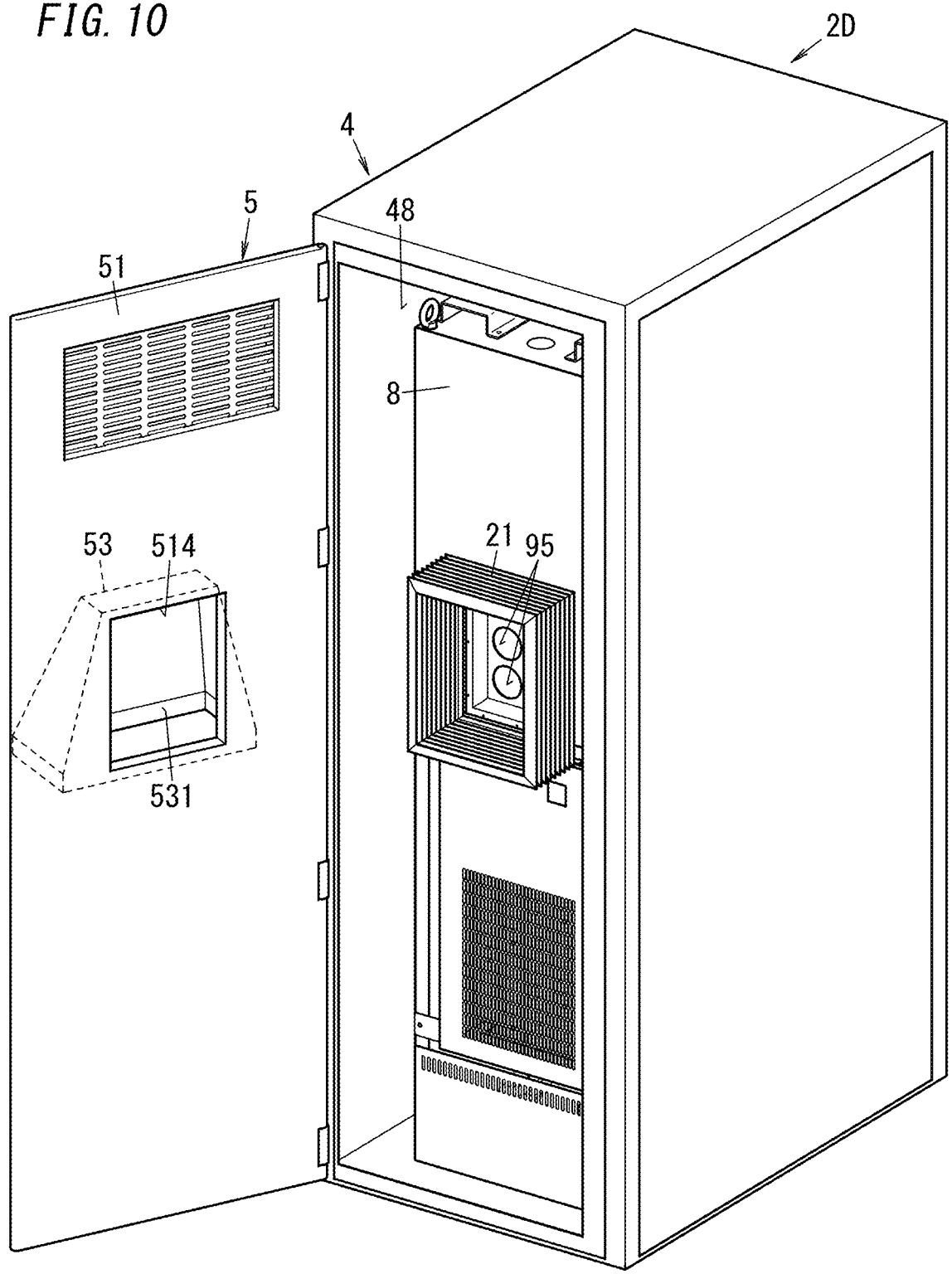
FIG. 10 is a perspective view of a power conversion system according to a third variation and illustrates a state where its cover is opened.

FIG. 10 illustrates a power conversion system 2D according to a third variation. As shown in FIG. 10, the deformable portion 21 may be attached to the inner housing 8, instead of the cover 5. In this case, when the opening 48 provided through the body 4 is uncovered by the cover 5, the first end of the deformable portion 21 is out of contact with any other member. The second end of the deformable portion 21 is attached to the inner housing 8. When the opening 48 provided through the body 4 is capped with the cover 5, the first end of the deformable portion 21 is in contact with the peripheral edges of the window 514 of the cover body 51. In addition, the deformable portion 21 is sandwiched between, and compressed by, the cover 5 and the inner housing 8.

According to another variation, the single or plurality of storage batteries 11 does not have to be installed outside of the outer housing 3 but may be arranged in the internal space 300 of the outer housing 3. Optionally, the single or plurality of storage batteries 11 may also be arranged in the flow channel F1 provided in the internal space 300 of the outer housing 3.

Furthermore, the deformable portion 21 according to the exemplary embodiment described above has the shape of a bellows. That is to say, the deformable portion 21 is compressed to be folded and stretches by returning from the folded state to an unfolded state. Alternatively, the deformable portion 21 may also be a member that stretches and shrinks due to elasticity, for example.

Furthermore, the air outlet 32 does not have to be provided through the exhaust hood 53. Alternatively, the air outlet 32 may also be a hole provided through the cover body 51, for example.

Optionally, the plurality of fans 95 may be attached to the cover 5.

Furthermore, the power converter 7 does not have to be implemented as a power conditioner. Alternatively, the power converter 7 may also be implemented as a DC/DC converter. The power converter 7 serving as a DC/DC converter may be connected, for example, between a DC power supply and the single or plurality of storage batteries 11.

Resume

The embodiment and its variations described above may be specific implementations of the following aspects of the present disclosure.

A power conversion system 2 (or 2B, 2C, 2D) according to a first aspect includes a housing (outer housing 3, 3B or 3C) and a power converter 7. The power converter 7 is arranged in an internal space 300 of the housing. An outer peripheral surface 301 of the housing is provided with an air inlet 31 and an air outlet 32. The air outlet 32 communicates with the air inlet 31 via the internal space 300 of the housing and is located below the air inlet 31.

According to this configuration, the air inlet 31 is located above the air outlet 32, thus reducing the chances of dust and other foreign particles entering the internal space 300 of the housing (outer housing 3, 3B, or 3C) through the air inlet 31.

In a power conversion system 2 (or 2B, 2C, 2D) according to a second aspect, which may be implemented in conjunction with the first aspect, the internal space 300 of the housing (outer housing 3, 3B, or 3C) is provided with a flow channel F1 to allow the air to flow between the air inlet 31 and the air outlet 32.

This configuration allows parts, provided on the flow channel F1, of the power converter 7 to be cooled more efficiently compared to a situation where no flow channels F1 are provided.

In a power conversion system 2 (or 2B, 2C, 2D) according to a third aspect, which may be implemented in conjunction with the second aspect, the power converter 7 includes an inner housing 8 (or 8B, 8C). The inner housing 8 (or 8B, 8C) is arranged in the internal space 300 of the housing (outer housing 3, 3B or 3C). A space (flow channel F11) between the inner housing 8 (or 8B, 8C) and the housing forms at least part of the flow channel F1.

According to this configuration, the air is present in the flow channel F11 between the inner housing 8 (or 8B, 8C) and the housing (outer housing 3, 3B, or 3C), thus decreasing the transfer of heat from outside of the housing into the inner housing 8 (or 8B, 8C). This reduces an increase in the temperature of the power converter 7.

A power conversion system 2 (or 2B, 2C, 2D) according to a fourth aspect, which may be implemented in conjunction with the third aspect, further includes a deformable portion 21. The deformable portion 21 is stretchable and shrinkable. The deformable portion 21 forms a partial flow channel F13 provided between the air outlet 32 and an internal space 800 (or 800B) of the inner housing 8 (or 8B, 8C). The partial flow channel F13 forms part of the flow channel F1. The housing (outer housing 3, 3B or 3C) includes a body 4 and a cover 5. The body 4 has an opening 48. The body 4 houses the power converter 7 therein. The cover 5 is mounted onto the body 4 and may cover and uncover the opening 48. The cover 5 is provided with the air outlet 32. The deformable portion 21 is attached to either the cover 5 or the inner housing 8 (or 8B, 8C) and is compressed and deformed by being sandwiched between the cover 5 and the inner housing 8 (or 8B, 8C).

This configuration allows, when an opening 48 provided through the body 4 is closed with the cover 5, the deformable portion 21 to be compressed and deformed by being sandwiched between the cover 5 and the inner housing 8 (or 8B, 8C). Thus, if the deformable portion 21 is attached to the cover 5, the deformable portion 21 and the inner housing 8 (or 8B, 8C) may be brought into close contact with each other even without connecting the deformable portion 21 to the inner housing 8 (or 8B, 8C) by screwing, for example. Likewise, if the deformable portion 21 is attached to the inner housing 8 (or 8B, 8C), the deformable portion 21 and the cover 5 may also be brought into close contact with each other even without connecting the deformable portion 21 to the cover 5 by screwing, for example.

In a power conversion system 2 (or 2B, 2C, 2D) according to a fifth aspect, which may be implemented in conjunction with the third or fourth aspect, the air inlet 31 is located at least partially above the inner housing 8 (or 8B, 8C).

This configuration reduces the chances of the flow of the air that has entered the internal space 300 of the housing (outer housing 3, 3B, or 3C) through the air inlet 31 being obstructed by the inner housing 8 (or 8B, 8C).

In a power conversion system 2 (or 2B, 2C, 2D) according to a sixth aspect, which may be implemented in conjunction with any one of the third to fifth aspects, part of the flow channel F1 is located in an internal space 800 (or 800B) of the inner housing 8 (or 8B, 8C). The inner housing 8 (or 8B, 8C) has at least three through holes 811. The plurality of through holes 811 exposes the internal space 800 (or 800B) of the inner housing 8 (or 8B, 8C) to a space (flow channel F11) between the inner housing 8 (or 8B, 8C) and the housing (outer housing 3, 3B or 3C). The space (flow channel F11) forms part of the flow channel F1. A direction leading from the space (flow channel F11) between the inner housing 8 (or 8B, 8C) and the housing toward the internal space 800 (or 800B) of the inner housing 8 (or 8B, 8C) via each of the at least three through holes 811 is different from a direction leading from the space (flow channel F11) between the inner housing 8 (or 8B, 8C) and the housing toward the internal space 800 (or 800B) of the inner housing 8 (or 8B, 8C) via any other one of the at least three through holes 811.

This configuration allows parts, arranged in the internal space 800 (or 800B) of the inner housing 8 (or 8B, 8C), of the power converter 7 to be ventilated from at least three directions and cooled.

In a power conversion system 2 (or 2B, 2C, 2D) according to a seventh aspect, which may be implemented in conjunction with any one of the second to sixth aspects, the power converter 7 includes: a heat-generating part (a power device 91 and a condenser 92) to generate heat; and a heat sink 93 serving as a heat-dissipating member. The heat sink 93 includes a supporting member 931 and a plurality of fins 932. The heat-generating part is mounted on the supporting member 931. The plurality of fins 932 protrudes from the supporting member 931 and is arranged in the flow channel F1. A thickness direction defined with respect to the plurality of fins 932 intersects with a direction in which the flow channel F1 runs.

This configuration allows the heat generated by the heat-generating parts (such as the power device 91 and the condenser 92) to be efficiently dissipated by the heat sink 93.

In a power conversion system 2 (or 2B, 2C, 2D) according to an eighth aspect, which may be implemented in conjunction with any one of the first to seventh aspects, the internal space 300 of the housing (outer housing 3, 3B or 3C) includes a first region (flow channel F1) and a second region (second partitioned space 820, third partitioned space 830, and space 840). The air sucked in through the air inlet 31 flows through the first region. The second region is separated from the first region by a partition. The power converter 7 includes at least one of a heat-dissipating member (heat sink 93) or a heat-generating part (transformer 71) to generate heat. The at least one of the heat-dissipating member or the heat-generating part is arranged at least partially in the first region.

According to this configuration, in the first region (flow channel F1) that the air enters through the air inlet 31, arranged at least partially is at least one member selected from the group consisting of a heat-dissipating member (heat sink 93) and a heat-generating part (transformer 71), thus allowing at least one of the heat-dissipating member or the heat-generating part to be cooled efficiently. In addition, the air that has flowed in through the air inlet 31 does not easily enter the second region (second partitioned space 820, third partitioned space 830, and space 840) separated from the first region via a partition. This reduces, when parts are arranged in the second region, the chances of those parts arranged in the second region collecting dust and other foreign particles thereon.

In a power conversion system 2 (or 2B, 2C, 2D) according to a ninth aspect, which may be implemented in conjunction with any one of the first to eighth aspects, the air outlet 32 downwardly regulates a flow of the air blowing from the internal space 300 of the housing (outer housing 3, 3B or 3C) toward outside of the housing.

This configuration reduces the chances of hot air exhausted from the air outlet 32 going back toward the air inlet 31, thus allowing the power converter 7 to be cooled efficiently.

In a power conversion system 2 (or 2B, 2C, 2D) according to a tenth aspect, which may be implemented in conjunction with any one of the first to ninth aspects, the air inlet 31 and the air outlet 32 are provided for a region of the outer peripheral surface 301 of the housing (outer housing 3, 3B or 3C). The region is located at one end in one direction.

According to this configuration, the air inlet 31 and the air outlet 32 are both provided for a region, located at one end in one direction, of the outer peripheral surface 301 of the housing (outer housing 3, 3B or 3C). Thus, there is no need to leave a surrounding space for the purpose of sucking in or exhausting the air for any region other than the region located at that one end. This makes it possible to cut down the space to be left around the housing compared to a situation where the air inlet 31 is provided at one end in one direction and the air outlet 32 is provided at the other side in the one direction.

In a power conversion system 2 (or 2B, 2C, 2D) according to an eleventh aspect, which may be implemented in conjunction with the tenth aspect, the housing (outer housing 3, 3B or 3C) includes a body 4 and a cover 5. The body 4 has an opening 48. The body 4 houses the power converter 7 therein. The cover 5 is mounted onto the body 4 and may cover and uncover the opening 48. The air inlet 31 and the air outlet 32 are provided through the cover 5.

According to this configuration, the air inlet 31 and the air outlet 32 are provided through the cover 5. This allows the space surrounding the cover 5 to be used as both a space for sucking in and exhausting the air and a space allowing an operator to enter to expose the opening 48 provided through the body 4 by turning the cover 5 and either operate, or do maintenance of, the parts inside the housing (outer housing 3, 3B, or 3C). This makes it possible to cut down the space to be left around the housing compared to a situation where at least one of the air inlet 31 or the air outlet 32 is provided for a part other than the cover 5.

A power conversion system 2 (or 2B, 2C, 2D) according to a twelfth aspect, which may be implemented in conjunction with any one of the first to eleventh aspects, further includes a fan 95. The fan 95 is arranged in the internal space 300 of the housing (outer housing 3, 3B or 3C).

This configuration allows the power converter 7 to be cooled even more efficiently.

In a power conversion system 2 (or 2B, 2C, 2D) according to a thirteenth aspect, which may be implemented in conjunction with the twelfth aspect, the housing (outer housing 3, 3B or 3C) includes a body 4 and a cover 5. The body 4 has an opening 48. The body 4 houses the power converter 7 therein. The cover 5 is mounted onto the body 4 and may cover and uncover the opening 48. In the internal space 300 of the housing, the fan 95 is arranged to face the cover 5.

This configuration allows the operator to do maintenance, including replacement and repair, of the fan 95 easily by turning the cover 5 to expose the opening 48 provided through the body 4.

In a power conversion system 2 (or 2B, 2C, 2D) according to a fourteenth aspect, which may be implemented in conjunction with any one of the first to thirteenth aspects, the power converter 7 includes a heat-dissipating member (heat sink 93) and a heat-generating part (transformer 71, power device 91, and condenser 92) to generate heat. A distance (airline distance L1 or L3) from the air inlet 31 to one member selected from the group consisting of the heat-dissipating member and the heat-generating part is longer than a distance (airline distance L2 or L4) from the air outlet 32 to the one member.

This configuration allows the air, of which the heat has been absorbed into one member selected from the group consisting of a heat-dissipating member (heat sink 93) and a heat-generating part (transformer 71, power device 91, and condenser 92), to reach the air outlet 32 by going over a shorter distance, compared to a situation where the distance (airline distance L1 or L3) from the air inlet 31 to the one member is shorter than a distance (airline distance L2 or L4) from the air outlet 32 to the one member. This allows the heat to be dissipated efficiently from the one member to the outside of the housing (outer housing 3, 3B, or 3C). In this case, the distance from the air inlet 31 to the one member and the distance from the air outlet 32 to the one member may be airline distances or distances as measured along a line drawn along the flow channel F1, whichever is appropriate.

Note that constituent elements other than the ones of the first aspect are not essential constituent elements for the power conversion system 2 (or 2B, 2C, 2D) but may be omitted as appropriate.

A power storage system 1 according to a fifteenth aspect includes the power conversion system 2 (or 2B, 2C, 2D) according to any one of the first to fourteenth aspects and a storage battery 11. The storage battery 11 is to be electrically connected to the power converter 7.

According to this configuration, in the housing (outer housing 3, 3B, or 3C) of the power conversion system 2 (or 2B, 2C, 2D), the air inlet 31 is located above the air outlet 32, thus reducing the chances of dust and other foreign particles entering the internal space 300 of the housing through the air inlet 31.

REFERENCE SIGNS LIST

1 Power Storage System
2, 2B, 2C, 2D Power Conversion System
21 Deformable Portion
3, 3B, 3C Outer Housing (Housing)
31 Air Inlet
32 Air Outlet
300 Internal Space
301 Outer Peripheral Surface
4 Body
48 Opening
5 Cover
7 Power Converter
71 Transformer (Heat-Generating Part)
8, 8B, 8C Inner Housing
800, 800B Internal Space
811 Through Hole
820 Second Partitioned Space (Second Region)
830 Third Partitioned Space (Second Region)
840 Space (Second Region)
91 Power Device (Heat-Generating Part)
92 Condenser (Heat-Generating Part)
93 Heat Sink (Heat-Dissipating Member)
931 Supporting Member
932 Fin
95 Fan
F1 Flow Channel (First Region)
F11 Flow Channel (Space)
F13 Flow Channel
L1, L2, L3, L4 Airline Distance (Distance)

The invention claimed is:

1. A power conversion system comprising:
a housing;
a power converter arranged in an internal space of the housing;
a deformable portion which is stretchable and shrinkable, an outer peripheral surface of the housing being provided with:
an air inlet; and
an air outlet configured to communicate with the air inlet via the internal space of the housing and located below the air inlet,
the internal space of the housing is provided with a flow channel configured to allow air to flow between the air inlet and the air outlet,
the power converter includes an inner housing arranged in the internal space of the housing, and
a space between the inner housing and the housing forms at least part of the flow channel,
the deformable portion forms, as a part of the flow channel, a partial flow channel provided between the air outlet and an internal space of the inner housing,
the housing includes:
a body having an opening and configured to house the power converter therein; and
a cover mounted onto the body and configured to cover and uncover the opening,
the cover is provided with the air outlet, and
the deformable portion is attached to either the cover or the inner housing and is configured to be compressed and deformed by being sandwiched between the cover and the inner housing.

2. The power conversion system of claim 1, wherein the air inlet is located at least partially above the inner housing.

3. The power conversion system of claim 1, wherein
the part of the flow channel is located in the internal space of the inner housing,
the inner housing has at least three through holes configured to expose the internal space of the inner housing to the space located between the inner housing and the housing which forms the part of the flow channel, and
a direction leading from the space between the inner housing and the housing toward the internal space of the inner housing via each of the at least three through holes is different from a direction leading from the space between the inner housing and the housing toward the internal space of the inner housing via any other one of the at least three through holes.

4. The power conversion system of claim 1, wherein the power converter includes: a heat-generating part configured to generate heat; and a heat sink serving as a heat-dissipating member, the heat sink includes: a supporting member on which the heat-generating part is mounted; and a plurality of fins protruding from the supporting member and arranged in the flow channel, and a thickness direction defined with respect to the plurality of fins intersects with a direction in which the flow channel runs.

5. The power conversion system of claim 1, wherein
the internal space of the housing includes: a first region through which the air sucked in through the air inlet flows; and a second region separated from the first region by a partition, the power converter includes at least one of a heat-dissipating member or a heat-generating part configured to generate heat, and the at least one member of the heat-dissipating member or the heat-generating part is arranged at least partially in the first region.

6. The power conversion system of claim 1, wherein the air outlet is configured to downwardly regulate a flow of the air blowing from the internal space of the housing toward outside of the housing.

7. The power conversion system of claim 1, wherein the air inlet and the air outlet are provided for a region of the outer peripheral surface of the housing, the region being located at one end in one direction.

8. The power conversion system of claim 7, wherein
the air inlet and the air outlet are provided through the cover.

9. The power conversion system of claim 1, further comprising a fan arranged in the internal space of the housing.

10. The power conversion system of claim 9, wherein
in the internal space of the housing, the fan is arranged to face the cover.

11. The power conversion system of claim 1, wherein
the power converter includes at least one member of a heat-dissipating member or a heat-generating part configured to generate heat, and a distance from the air inlet to the at least one member is longer than a distance from the air outlet to the at least one member.

12. A power storage system comprising:
the power conversion system of claim 1; and
a storage battery to be electrically connected to the power converter.

* * * * *